(12) United States Patent
Morishige et al.

(10) Patent No.: US 6,890,387 B2
(45) Date of Patent: May 10, 2005

(54) METHOD AND DEVICE FOR CORRECTING PATTERN FILM ON A SEMICONDUCTOR SUBSTRATE

(75) Inventors: Yukio Morishige, Tokyo (JP); Makoto Oomiya, Tokyo (JP)

(73) Assignee: Laserfront Technologies, Inc., Kanagawa (JP)

(*) Notice: Subject to any disclaimer, the term of this patent is extended or adjusted under 35 U.S.C. 154(b) by 234 days.

(21) Appl. No.: 09/981,712

(22) Filed: Oct. 19, 2001

(65) Prior Publication Data

US 2002/0047095 A1 Apr. 25, 2002

(30) Foreign Application Priority Data

Oct. 19, 2000 (JP) .......... 2000-320107

(51) Int. Cl.[7] .......... C23C 16/00; H05H 1/00; C23F 1/00
(52) U.S. Cl. .......... 118/722; 156/345.5
(58) Field of Search .......... 118/722, 620, 118/50.1, 641, 712; 156/345.5

(56) References Cited

U.S. PATENT DOCUMENTS 4,628,531 A * 12/1986 Okamoto et al. .......... 382/144
5,634,230 A * 6/1997 Maurer .......... 15/1.51

FOREIGN PATENT DOCUMENTS

| JP | 57-124437 | 8/1982 | |
| JP | 61-279690 | 12/1986 | |
| JP | 62-044742 | 2/1987 | |
| JP | 63-36249 | 2/1988 | |
| JP | 03104869 A | * 5/1991 | .......... C23C/16/48 |
| JP | 05259247 A | * 10/1993 | .......... H01L/21/66 |
| JP | 07-104459 | 2/1995 | |
| JP | 7-104459 | 4/1995 | |
| JP | 8-62827 | 3/1996 | |
| JP | 8-227145 | 9/1996 | |
| JP | 10-324973 | 12/1998 | |
| JP | 11-186123 | 7/1999 | |
| JP | 3036687 | 2/2000 | |

* cited by examiner

Primary Examiner—Parviz Hassanzadeh
(74) Attorney, Agent, or Firm—Foley & Lardner LLP

(57) ABSTRACT

In order to correct a white defect on a surface of a substrate, the substrate is held with the surface facing downward, laser light is upward irradiated at the defect on the surface in material gas, and as a result, the white defect is covered with film.

14 Claims, 2 Drawing Sheets

METHOD AND DEVICE FOR CORRECTING PATTERN FILM ON A SEMICONDUCTOR SUBSTRATE

BACKGROUND OF THE INVENTION

This invention relates to correction of pattern on a semiconductor substrate and, particularly, on a semiconductor photo mask.

A semiconductor photo mask is used for exposing a circuit pattern on a wafer in a manufacturing process of a semiconductor device, a liquid crystal display device, etc. A semiconductor photo mask is a transparent substrate on that a minute pattern film, which is an opaque film, is formed. When the pattern film is formed on the substrate, two types of defects may occur; a white defect or clear defect, at which a part of the pattern film is lost, and a black defect or an opaque defect, at which the substrate is unnecessarily covered with film.

For correcting white defects on a semiconductor photo mask, laser CVD (chemical vapor deposition) is available. According to laser CVD, laser light is irradiated at the white defects on the substrate in material gas including chromium. Laser light thermally resolves material gas around the white defects and as a result, film including chromium grows over the white defects.

An example of conventional technique for correcting white defects on a semiconductor photo mask is Japanese Patent number (JP-B) 3036687 which is hereinafter referred to as first conventional technique. According to the first conventional technique, an optical system for laser irradiator/laser microscope, which includes laser light source and a unit for irradiation/observation, is arranged above the substrate set in material gas. The optical system downward irradiates laser light at white defects on the substrate. The optical system shapes laser light by its slit and projects a pattern on the substrate. As a result, the optical system corrects white defects precisely.

On the other hand, black defects, namely unnecessary part of pattern film, is conventionally vaporized to correct a semiconductor photo mask by irradiating laser light on the part.

Japanese Unexamined Patent Publication (JP-A) number H7-104459, namely 104459/1995 is titled "Method and apparatus for correcting defects on a photo mask", which is hereinafter referred to as second conventional technique. According to the second conventional technique, first, pattern film is printed on one surface of transparent substrate. Next, the substrate is laid on the surface. Then, laser light is irradiated from the other surface through the substrate at black defects to vaporize the black defects. Since the former surface faces downward, particles generated when the black defects are vaporized drop down, and therefore, are not stuck on the former surface.

According to the first conventional technique, laser light is irradiated down at white defects on a substrate to form the pattern film covering the white defects. Laser CVD generates particles from decomposed material gas. The particles in the air fall down and are struck again around the area at which laser light has been irradiated on the substrate. From the struck particles, CVD forms unnecessary film on the substrate. As a result, edge of the pattern film swells up on border of the mask pattern. Compared with the second conventional technique, the first conventional technique has less precision.

According to the second conventional technique, on the other hand, the surface of the substrate on which laser light is irradiated faces downward, and consequently, most particles generated by laser light fall down. However, 0.1 $\mu$m or smaller particles often stick on the substrate again and cause a decline of transmittance around the area at which laser light has been irradiated. The decline of transmittance seriously affects the newest apparatus for correcting photo mask in 0.13 $\mu$m rule, which corresponds to 0.5 $\mu$m rule on its original photo mask.

SUMMARY OF THE INVENTION

It is an object of the present invention to provide a method and a device for correcting defects of pattern film on a surface of a substrate in high accuracy.

According to the present invention, the method comprises the steps of: holding the substrate with the surface facing downward; irradiating laser light upward at a white defect on the surface; blowing material gas for forming pattern film to the surface; and forming pattern film over the white defect.

The method may further comprise the steps of: irradiating laser light upward at a black defect on the surface; and vaporizing unnecessary part of pattern film in order to correct the black defect.

The method may further comprise the steps of: blowing oxygen gas to the surface; irradiating first laser light upward to unnecessary part of pattern film on the surface in order to oxidize the top layer of the part; irradiating second laser light upward to the oxidized top layer in order to peel the oxidized top layer off; and repeating the steps of irradiating first and second laser light in order to eliminate the unnecessary part of pattern film.

The step of blowing may further blow purge gas, which prevents a window for conducting laser light from clouding, and carrier gas, which is included in CVD gas for carrying material gas; and the main component of the purge and carrier gases may be helium gas.

The substrate may be sucked in order to be held at the step of holding.

According to the present invention, the device comprises: a holder for holding the substrate with the surface facing downward; a laser irradiator for irradiating laser light upward at a white defect on the surface; a gas circulatory unit for providing and withdrawing gas including material gas; a gas window for blowing material gas on the surface and conducting laser light from the laser source through the gas window to the white defect in order to form pattern film over the white defect.

The device may further comprise an optical unit for observing pattern film on the substrate. In this case, the substrate may be permeable to light and the device further may comprise a penetrating light source for irradiating light through the substrate to the lower surface of the substrate in order to illuminate with the lower surface. Moreover, the sucking unit may comprise a top cover permeable to light, and the penetrating light source may comprise a lens that is designed to compensate the distortion of the lens with reference to the total thickness of the cover and the substrate.

According to the device, the laser irradiator may comprise first laser source for irradiating first laser light for vaporizing pattern film, and second laser source for irradiating second laser light for laser CVD. In this case, the first laser light is irradiated through the gas window at black defects in order to vaporize the black defects. The second laser light is irradiated through the gas window at white defects with material gas provided by the gas circulatory unit in order to form film over the white defects.

According to the device, the gas circulatory unit may provide purge gas, which prevents a window for conducting laser light from clouding, and carrier gas, which is included in CVD gas for carrying material gas. Preferably, the main component of the purge and carrier gases is helium gas.

The holder may suck the substrate in order to hold the substrate.

DESCRIPTION OF THE PREFERRED EMBODIMENTS

1. First Embodiment

Figure 1:
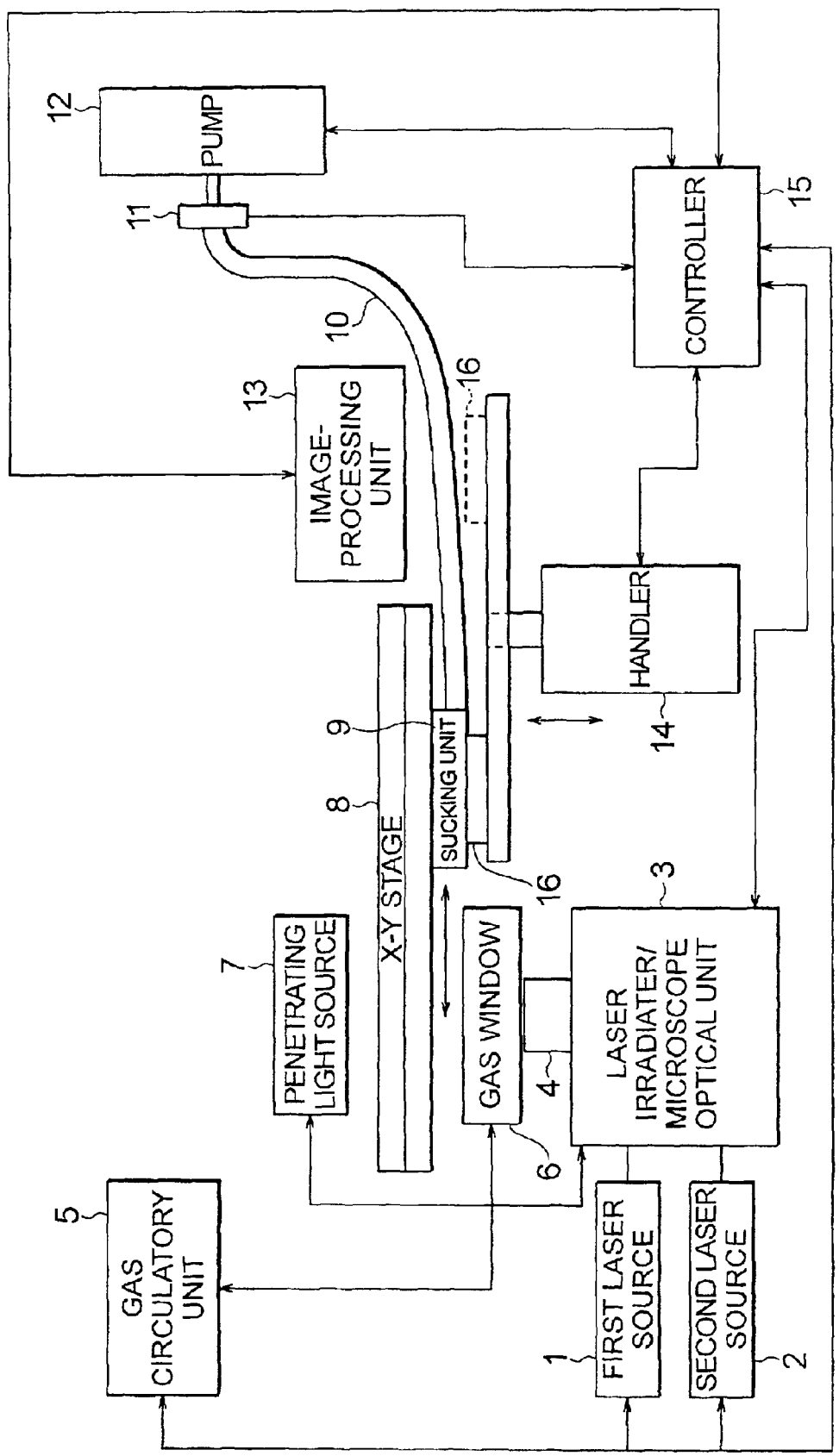
FIG. 1 shows a block diagram for use in describing a pattern-correcting device of the present invention.

Description will be made about an embodiment, a pattern-correcting device of the present invention. With reference to FIG. 1, first laser source (laser source 1) provides laser light for vaporizing film, namely for correcting black defects and includes Nd:YVO4 laser which generates laser light in pulse width 0.8 ns, wavelength 355 nm and oscillation frequency 3 Hz. Second laser source (laser source 2) provides laser light for laser CVD, namely for correcting white defects and includes Nd:YLF laser which generates laser light in pulse width 30 ns, wavelength 349 nm and oscillation frequency 7 Hz.

A laser irradiator/microscope optical unit 3 irradiates laser light generated by the laser sources 1 and 2 to a lower surface of a substrate 16, which is permeable to light, and works as a microscope for observing a pattern on the substrate 16. The laser irradiator/microscope optical unit 3 is arranged under the substrate 16 in order to irradiate laser light upward through a gas window 6 to the lower surface. An object lens 4 condenses laser light irradiated from the laser irradiator/microscope optical unit 3 and guides the laser light through the gas window 6 to the substrate 16.

A gas circulatory unit 5 is connected with the gas window 6 through a pipe. The gas circulatory unit 5 provides CVD and purge gases. Further, the gas circulatory unit 5 withdraws and immunizes the gases exhausted from the gas window 6. The CVD gas includes material and carrier gases. For example, the material gas is chromium carbonyl gas, the carrier and purge gases are helium gas or argon gas.

The gas window 6 is arranged under the substrate 16. The gas window 16 has a structure for covering the lower surface of the substrate 16 and has a window for receiving laser light through the object lens 4 from the laser irradiator/microscope optical unit 3. The gas window 6 is provided the CVD and purge gases from the gas circulatory unit 5 through the pipe, and sprays on the lower surface of the substrate 16 the CVD gas, which includes material gas for pattern film, and the purge gas, which prevents from clouding the window. Further, the gas window 6 sucks the sprayed gas to exhaust it to the gas circulatory unit 5.

Figure 2:
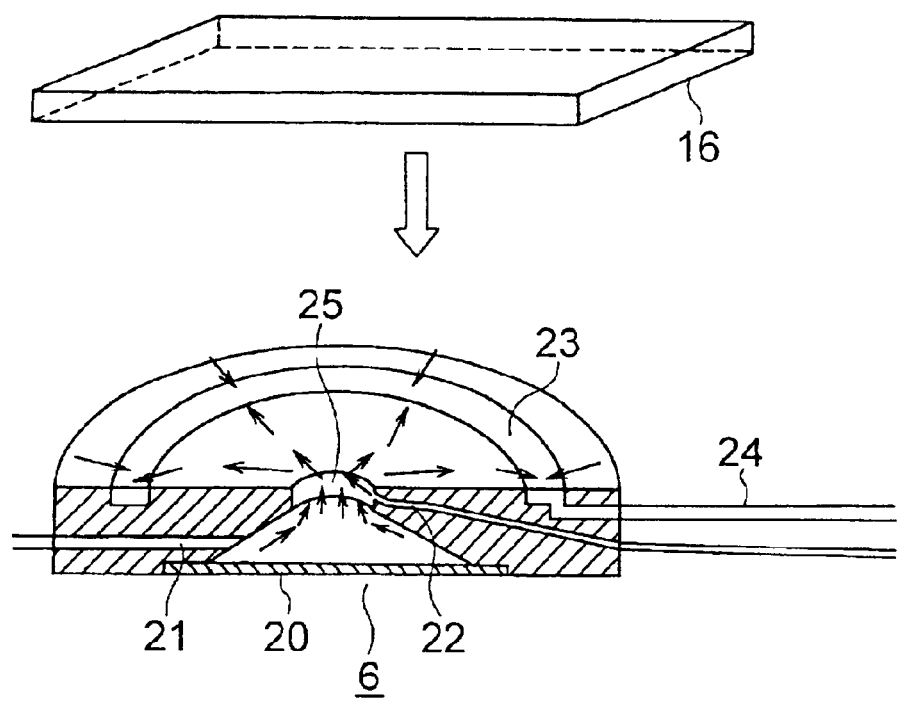
FIG. 2 shows a sectional view for use in describing the gas window 6 of the present invention.

Detail of the gas window 6 is shown in FIG. 2. In order to distinctly show the structure of the gas window 6, in FIG. 2, the gas window 6 is distinctly separated from the substrate 16. However, the gas window 6 and the substrate 16 are actually spaced about 0.5 mm.

As shown in FIG. 2, the gas window 6 is arranged under the substrate 16. The gas window 6 has a cylindrical shape with a roughly conical cavity at the center of the gas window 6. The bottom of the gas window 6, namely the lower face of the gas window 6 toward the object lens 4, has an opening larger than another opening on the upper face of the gas window 6. The opening on the lower face is occupied by a window 20, which stops the gases but conducts laser light from the laser irradiator/microscope optical unit 3 via the object lens 4.

On the side of the gas window 6, a purge gas nozzle 21 and a material supply nozzle 22 are embedded through the cavity. The purge gas nozzle 21 is opened near the window 20 in order to spout purge gas for preventing clouding the window 20. The material supply nozzle 22 is opened near a laser-irradiating hole 25, which is opened on the upper face of the gas window 6, in order to spout the CVD gas out to the cavity, which includes material and carrier gases and is provided from the gas circulatory unit 5.

Furthermore, the upper face of the gas window 6 has a round groove 23 on a circumference centering at the laser-irradiating hole 25. The gas sprayed on the substrate 16 is sucked from the round groove 23 and is exhausted through a suction pipe 24 to the gas circulatory unit 5.

Arrows shown in FIG. 2 denote directions to which gas around the upper face of the gas window 6 flows. The purge gas first spouts out from the purge gas nozzle 21 to the window 20, next rises through the laser-irradiating hole 25, then flows between the gas window 6 and the substrate 16 to the round groove 23, and after that is exhausted through the suction pipe 24. The CVD gas first spouts out from the material supply nozzle 22 through the laser-irradiating hole 25 to the lower surface of the substrate 16, next flows between the gas window 6 and the substrate 16 to the round groove 23, and then is exhausted through the suction pipe 24.

Not only the purge and CVD gases, but also the air around the gas window 6 is sucked through the round groove 23. Consequently, the CVD and purge gases spouted through the laser-irradiating hole 25 are isolated from the air around the gas window 6. As a result, the pattern-correcting device can steadily deposit pattern film on the substrate 16 by laser CVD without a vacuum device.

Laser light irradiated from the laser irradiator/microscope optical unit 3 through the object lens 4 is conducted from the window 20, passes through the cavity of the gas window 6 and the laser-irradiating hole 25 and is irradiated on the lower surface of the substrate 16.

Turning again to FIG. 1, a penetrating light source 7 lights up the translucent/transparent substrate 16 in order to observe minute pattern on the substrate 16 by the laser irradiator/microscope optical unit 3. The penetrating light source 7 is designed to have an optimized optic angle with reference to compensation for thickness of the substrate 16 and a translucent cover 31 of a sucking unit 9 (see FIG. 3).

The laser irradiator/microscope optical unit 3, the object lens 4, the gas window 4 and the penetrating light source 7 compose an optical system for observing minute pattern on the substrate 16. The wavelength of the light for observing is 365 nm. In a observing mode, the penetrating light source 7, an observing light and a slit light are available for light source of the optical system. The slit light projects shape of irradiated laser light on the substrate 16.

A X-Y stage 8 horizontally carries the substrate 16 between the place of delivery on a handler 14 (the place where the substrate 16 is drawn in solid line in FIG. 1) and the place over the gas window 6. The X-Y stage 8 is permeable to light in order that light from the penetrating light source 7 can penetrate the X-Y stage 8.

Figure 3:
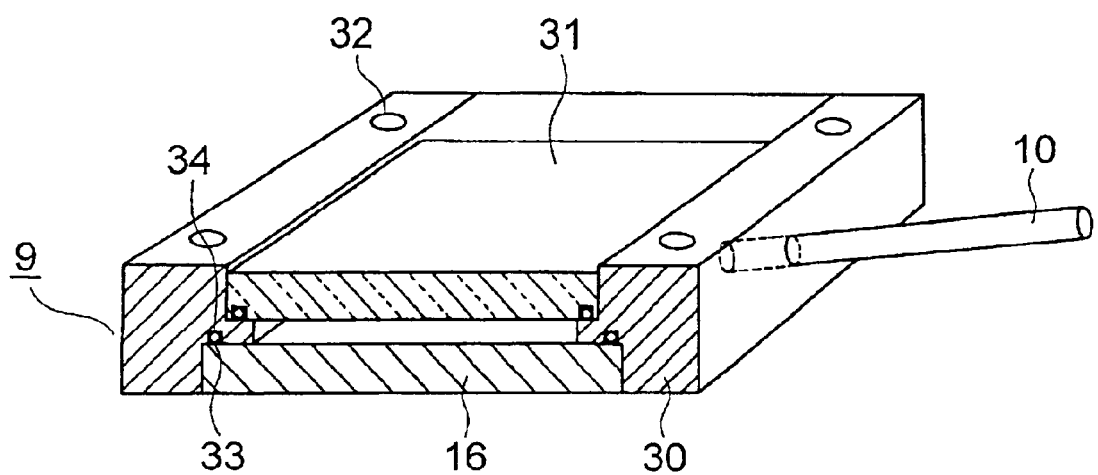
FIG. 3 shows a sectional view for use in describing the sucking unit 9 of the present invention.

A sucking unit 9 is fixed on the X-Y stage 8 to adhere to and hold the substrate 16. The following description shows detailed structure of the sucking unit 9. As shown in FIG. 3, the sucking unit 9 includes an sucking mount 30 that has a square frame shape. A 3-mm thickness translucent cover 31 is embedded in the top of the frame of the sucking mount 30. Female screws 32 for fixing the sucking mount 30 on the X-Y stage 8 are embedded on the top of the sucking mount 30. An o-ring groove 33 is cut around the inside of the sucking mount 30 under the translucent cover 31. A rubbery o-ring 34 is embedded in the o-ring groove 33 in order to keep the space between the sucking unit 9 and the substrate 16 airtight.

On the side of the sucking mount 30, a tube 10 is inserted. As shown in FIG. 1, the tube 10 is connected via a pressure sensor 11 with a pump 12. The pump 12 sucks out the air in the space between the sucking unit 9 and the substrate 16, and consequently, the sucking unit 9 adheres to the substrate 16.

As shown in FIG. 3, the lower surface of the substrate 16 corresponds to the lower surface of the sucking unit 9 when the sucking unit 9 adheres to the substrate 16. This structure of the pattern-correcting device allows the X-Y stage 8 to move without obstruction in a horizontal plane with keeping a minute space between the gas window 6 and the substrate 16. To keep the minute space allows gas between the gas window 6 and the substrate 16 to flow steadily. Therefore, this structure prevents turbulence of gas damaging formation of pattern film and causing a gas leak from the inside of the gas window 6.

Turning again to FIG. 1, an image-processing unit 13 takes image of the substrate 16 on the handler 14 in order to confirm whether the substrate 16 is put on a stand of the handler 14 at a correct position.

When the substrate 16 is put on the stand of the handler 14, the handler 14 turns around to the place of delivery of the substrate 16 to the sucking unit 9. Then, the handler 14 lifts up the stand by its Z-axis mechanism in order that the sucking unit 9 becomes available for adhering to the substrate 16.

After finishing correcting defects of a photo mask, the sucking unit 9 releases the substrate 16 and puts the substrate 16 on the stand of the handler 14. Then, the handler 14 lowers the stand by the Z-axis mechanism and turns around to the place for taking out the substrate 16 from the pattern-correcting device.

A controller 15 controls workings of the pattern-correcting device; the laser sources 1 and 2, laser irradiator/microscope optical unit 3, gas circulatory unit 5, penetrating light source 7, X-Y stage 8, pressure sensor 11, pump 12, handler 14 and image-processing unit 14.

Description will be made about the working process of the pattern-correcting device of the present invention.

(1) A photo-mask-examining device has previously detected white and black defects on a photo mask. The photo-mask-examining device acquires information about defects. Hereinafter, the data that represents the information about the defects is referred to as defect data. The defect data include data representing where and which defects are detected and are stored in the controller 15 of the pattern-correcting device.

First, an operator of the pattern-correcting device puts the substrate 16 of a 6-inch photo mask on the stand of the handler 14. The controller 15 makes the image-processing unit 13 recognize the substrate 16 on the stand of the handler 14 in order to acquire information about positioning the substrate 16 on the stand of the handler 14. The positioning information includes position of the center of the substrate 16 and an angle that the substrate 16 is set in X-Y plane. With reference to the positioning information, the controller 15 directs the handler 14 to turn around the stand so as to suppress disagreement between the angle of the substrate 16 and the angle of the sucking unit 9 when substrate 16 moves to the place for delivery to the sucking unit 9. Simultaneously, the controller 15 directs the X-Y stage 8 to tune in its horizontal position exactly in order that the substrate 16 is positioned just under the sucking unit 9 when the stand of the handler 14 turns around to the place for delivery.

Next, the controller 15 directs the handler 14 to lift the Z-axis mechanism up to the predetermined position, and the pump 12 to start to suck out the air in the sucking unit 9. With reference to pressure measured by the pressure sensor 11, the pump 12 adjusts conductance of the sucking unit 9 in order that the pressure inside the sucking unit 9 becomes 0.3 atm. Further, the controller 15 directs the handler 14 to lower the Z-axis mechanism to a ready position and to stand by.

After the sucking unit 9 adheres to the substrate 16, the controller 15 directs the X-Y stage 8 to move the substrate 16 to the position over the gas window 6. On this situation, the controller 15 directs the gas circulatory unit 5 to provide purge gas and CVD gas to the gas window 6. It is assumed that: each of the carrier gas included in the CVD gas and purge gas is argon gas; the material gas included in the CVD gas is chromium carbonyl gas; the flow rate of the CVD gas is 70-sccm; and the flow rate of the purge gas is 1500-sccm.

With reference to the defects data previously stored in the controller 15, the controller 15 directs the X-Y stage 8 to move the substrate 16 so as to a white defect on the substrate 16 is positioned right above the laser-irradiating hole 25 of the gas window 6. The operator observes the white defect on the substrate 16 by the laser irradiator/microscope optical unit 3 with her/his own eyes to make sure, and next, exactly tunes in size, angle and position of a slit for irradiating laser of the laser irradiator/microscope optical unit 3. Then, the laser source 2, which irradiates laser light for CVD, irradiates laser light 5 seconds at the white defect to form film. These processes are repeated for all of the white defects on the substrate 16.

When all of the white defects on the substrate 16 are corrected, the operator stops providing CVD gas and only provides purge gas. Next, the controller 15 directs the X-Y stage 8 to move a black defect on the substrate 16 just above the laser-irradiating hole 25 of the gas window 6. The operator observes the black defect on the substrate 16 by the laser irradiator/microscope optical unit 3 with her/his own eyes to make sure, and next, exactly tunes in size, angle and position of a slit for irradiating laser of the laser irradiator/microscope optical unit 3. Then, the laser source 1, which irradiates laser light for vaporizing film, irradiates two shots of laser light at the black defect to vaporize unnecessary part of pattern film. These processes are repeated for all of the black defects on the substrate 16.

After all of the black defects on the substrate 16 are corrected, the controller 15 stops providing purge gas and directs the X-Y stage 8 to move the sucking unit 9 over the stand of the handler 14. Then, the controller 15 directs the handler 14 to lift its Z-axis mechanism up and the sucking unit 9 to release the substrate 16 in order to put on the substrate 16 on the stand of the handler 14. Next, the controller 15 directs the handler 14 to lower the Z-axis mechanism and turn around the substrate 16 to the place where the operator can receive the substrate 16. Finally, the operator 16 takes out the substrate 16 from the pattern-correcting device.

(2) Compared with a typical conventional technique, the pattern-correcting device is described below.

Conventionally, a laser light source for forming film on a substrate is arranged over the substrate, and irradiates laser light downward to the substrate. It is assumed that a 5 μm×5 μm square of chromium film will be formed on a substrate under ideal processing condition according to this conventional technique. Argon gas is used for purge and CVD gas. In this case, though laser light is irradiated to a 5 μm×5 μm square on the substrate, it is probable that CVD size, which means size of film actually formed on the substrate, grows to about 5.4 μm×5.4 μm. Further, CVD size is fluctuant over 0.1 μm even under the same condition.

On the other hand, it is assumed that the same square will be formed on a substrate under ideal processing condition according to the pattern-correcting device of the present invention. In this case, when laser light is irradiated to a 5 μm×5 μm square on the substrate, the CVD size grows to about 5.2 μm×5.2 μm. The fluctuation of CVD size is about 0.07 μm. Moreover, when helium gas is used for purge and CVD gases instead of argon gas and light is irradiated to a 5 μm×5 μm square on the substrate, there is great improvement in both growth and fluctuation of the CVD size. In this case, the CVD size is 4.9 μm×4.9 μm and the fluctuation of the CVD size is 0.03 μm.

Mean free path of particles in helium gas is about ten times longer than that in argon gas or the air. Consequently, particles are diffused more rapidly and widely in helium gas than in argon gas or the air. As a result, in helium gas, the particles caused by laser CVD leave from the substrate faster, and density of the particles near the substrate, which is possible to stick on the substrate again, is lower than in argon gas or the air. This effect is available even if one of purge and carrier gases is argon gas and the other is helium gas.

Regardless of type of gas in which the substrate is arranged, as mentioned above, since laser light is irradiated upward on the lower surface of the substrate 16, the particles caused by processes for correcting defects fall down. As a result, the probability that the particles stick on the substrate again reduces greatly.

As shown in FIG. 2, purge gas at the top of the gas window 6 becomes ascending current. The ascending current blows against the substrate 16 and causes a boundary layer of gas flow under the substrate 16. The boundary layer has a thickness several ten micron-meters. In the boundary layer, the particles fall down. On the other hand, under the boundary layer, the particles are caught in a radial current from the top center of the gas window 6 to the round groove 23.

The thickness of the boundary layer depends on viscosity of gas, flatness of the substrate 16, etc. Generally, the boundary layer is thicker in argon gas than in helium gas. However, since mean free path of particles in helium gas is longer than in argon gas, CVD size by laser CVD is tighter in helium gas than in argon gas.

(3) Next, description will be made about working process of the sucking unit 9.

The sucking unit 9 applies negative pressure to the upper surface of the substrate 16, which is opposite to the lower surface for masking, in order to adhere to the substrate 16. This method of holding is effective because: the substrate 16 can be held as its lower surface for masking faces downward; and there is no obstacle between the lower surface of the substrate 16 and the gas window 6.

The top of the sucking unit 9 is covered with the translucent cover 31. With reference to the total thickness of the translucent cover 31 and the substrate 16, compensation for distortion of the lens included in the penetrating light source 7 can be optimized, namely, optical distortion of light irradiated by the penetrating light source 7 can be compensated. Consequently, the optical system for illuminating, which includes the penetrating light source 7, the translucent cover 31 and the substrate 16, can be given a numerical aperture optimized for the numerical aperture of the object lens 4. As a result, the operator can observe pattern mask on the substrate 16 as high-resolution image.

Negative pressure that the sucking unit 9 applies to the substrate 16 may be selected according to the thickness of the substrate 16. For example, when the substrate 16 is 5 inch square and 2.3-mm thickness, the negative pressure may be low, such as 0.3 kg/cm$^2$. This can prevent the negative pressure breaking the substrate 16.

The pattern-correcting device mentioned above stops providing CVD gas when eliminating unnecessary pattern film, namely when correcting black defects. However, effect of correcting black defects with providing CVD gas hardly seems to be different from effect of correcting black defects without providing CVD gas. Therefore, the pattern-correcting device does not have to stop providing CVD gas when correcting black defects. To stop providing CVD gas when correcting black defects allows the pattern-correcting device to save material gas consumption, and as a result, replacement of material gas can be delayed.

Further, according to the pattern-correcting device mentioned above, the inclination of the substrate 16 is not checked after the sucking unit 9 adheres to the substrate 16. However, the pattern-correcting device may include an interlock mechanism for checking the inclination of the substrate 16 if necessary. The interlock mechanism, for example, includes sensors for measuring height of the substrate 16.

According to the pattern-correcting device mentioned above, the surface processed for correcting defects faces downward when the surface is held by the sucking unit 9 in order to correct white defects on a photo mask by laser CVD. Consequently, the pattern-correcting device can prevent from sticking again particles caused by laser CVD on the substrate 16. The difference between the area on the substrate 16 irradiated by laser light and the area on the substrate 16 covered with film is smaller. The fluctuation of the area covered with film is smaller. As a result, the pattern-correcting device can process photo mask with high accuracy.

Further, the pattern-correcting device includes two laser sources. One of the laser sources irradiates laser light for vaporizing film. The other irradiates laser light for laser CVD. Consequently, a single one of the pattern-correcting device can execute by itself functions for correcting both white and black defects. Both of the laser sources irradiate laser light to the lower surface of the substrate. Consequently, particles both caused by laser CVD for correcting white defects and caused by vaporizing unnecessary film for correcting black defects fall down and do not stick again on the substrate. As a result, the pattern-correcting device can correct white and black defects on a photo mask in high accuracy.

Further, helium gas may be available for the main component of purge gas and carrier gas and prevents particles caused by laser CVD from sticking again on the substrate 16. According to helium gas, the pattern-correcting device can process pattern film on the substrate 16 in higher accuracy.

Further, in order to hold the substrate 16, the sucking unit 9 adheres to the substrate 16 when correcting defects of pattern film on the substrate 16. To adhere to the substrate 16 allows the substrate 16 facing downward when the sucking unit 9 holds the substrate 16.

Further, compensation for distortion of the lens included in the penetrating light source 7 is optimized with reference to the total thickness of the translucent cover 31 and the substrate 16 for the numerical aperture of the object lens 4. As a result, the operator can observe pattern mask on the substrate 16 as high-resolution image.

2. Second Embodiment

The second embodiment is provided for improving a method of correcting black defects, which is unnecessary part of film, on a photo mask. The pattern-correcting device of the first embodiment mentioned above is applied for the following description of the second embodiment.

According to the first embodiment, argon or helium gas is provided as purge gas. On the other hand, according to the second embodiment, oxygen gas is provided as purge gas and no CVD gas is provided. In this situation, the laser source 1 irradiates one shot of laser light to a black defect. The shot has twenty-five percent strength of laser light which is conventionally irradiated for eliminating a black defect. The shot eliminates chromium oxide film, which is formed on the top surface of chromium film as an AR court layer b (film preventive of reflection), about 200-angstrom in order to expose a layer lower than the AR court layer.

Next, the laser source 2 irradiates laser light 0.5 second on the substrate 16. This time, the strength of the laser light is less than strength for vaporizing chromium film in order that the top of the exposed chromium layer is oxidized and changes color. Then, the laser source 1 irradiates another laser shot on the exposed chromium layer. After that, the exposed chromium layer is peeled off and another chromium layer is newly exposed. After exposure and peeling of a chromium layer are repeated about ten times, chromium film of a black defect on the substrate 16 is eliminated and a glass surface of the substrate 16 appears.

The second embodiment can eliminate black defects by laser light with twenty five percent lower strength than laser light used in conventional technique. Lower strength of laser light allows the substrate 16 to be less damaged. According to conventional techniques for eliminating black defects, a quartz glass layer of the substrate 16 is dug 300-angstrom depth on average under even an optimized condition. On the other hand, according to the second embodiment, the quartz glass layer is dug 50-angstrom depth.

According to the second embodiment, the chromium film is oxidized and then is eliminated. Molecular weight of chromium oxide is larger than that of non-oxidized chromium. Therefore, the particles that the second embodiment produces when eliminating chromium film is easy to fall down, and as a result, hardly sticks again on the substrate 16. Compared with conventional technique for eliminating black defects, the second embodiment can form film on the substrate 16 whose edges are highly straight and have smooth walls. Further, when a 5 μm×5 μm square black defect on the substrate 16 has been corrected according to conventional techniques, transmittance around the corrected black defects on the substrate 16 declines about 1.5 percent. On the other hand, when the same black defect has been corrected according to the second embodiment, the transmittance drops only 1.0 percent or less.

According to the present invention, the substrate is held with the surface facing downward and material gas for forming pattern film is blown on the surface. In this situation, laser light is irradiated upward at a white defect in order to form pattern film over the white defect. When the laser light is irradiated at the white defect, particles are generated. However, the particles fall down and do not stick again to the substrate. Consequently, the present invention can prevent pattern film from overgrowing and growing irregularly in size. As a result, according to the present invention, a photo mask is processed in high accuracy.

Further, in order to correct a black defect on the substrate, laser light may be upward irradiated at the black defect to vaporize unnecessary part of pattern film. Though particles are generated in the air when the black defect is vaporized, the particles fall down and do not stick again to the substrate.

In order to eliminate unnecessary part of pattern film, the present invention may repeatedly both oxidize the top layer of pattern film and peel the layer off. In this case, one layer peeled off at a time is so thin that the substrate is damaged less to eliminate unnecessary part of pattern film.

Helium gas is available for purge and CVD gas of the pattern-correcting device of the present invention. When purge and CVD gas include helium gas as the main component, less particles stick again to the substrate.

In order to hold the substrate, the present invention may suck the substrate. To suck the substrate is helpful to downward face the surface of the substrate on which defects are irradiated by laser light.

The pattern-correcting device including the top cover and the lens allows its operator to observe the substrate with penetrating light in high resolution.

While this invention has thus far been described in conjunction with a few embodiments thereof, it will be readily possible for those skilled in the art to put the this invention into various other manners.

What is claimed is:

1. A device for correcting defects of pattern film on a surface of a substrate, comprising:
   a holder for holding the substrate with the surface facing downward;
   a laser irradiator for irradiating laser light upward at a white defect on the surface; and
   a gas window for blowing material gas on the surface and conducting laser light from the laser irradiator through the gas window to the white defect in order to form pattern film over the white defect,
   wherein the laser irradiator comprises a first laser source for irradiating first laser light for vaporizing pattern film, and a second laser source for irradiating second laser light for laser CVD, and
   wherein the holder sucks the substrate in order to hold the substrate,
   wherein the gas window comprises:
      a gas circulatory unit for providing gases to the gas window;
      a flat lower window for receiving laser light;
      a round groove;
      a laser irradiating hole provided between the round groove and the flat lower window;
      a first opening provided closer to the flat lower window than the laser irradiating hole, the first opening providing purge gas from the gas circulatory unit into the gas window;

a second opening provided closer to the laser irradiating hole than the flat lower window, the second opening providing material gas from the gas circulatory unit into the gas window; and a third opening provided adjacent to the round groove, the third opening sucking the purge gas out of the gas window.

2. The device claimed in claim 1, further comprising an optical unit for observing pattern film on the substrate.

3. The device claimed in claim 2, wherein the substrate is permeable to light, further comprising a penetrating light source for irradiating light through the substrate to the lower surface of the substrate in order to illuminate the lower surface.

4. The device claimed in claim 3, further comprising:

a sucking unit having a top cover permeable to light;

wherein the penetrating light source comprises a lens that is designed to compensate the distortion of the lens with reference to a total thickness of the cover and the substrate.

5. The device claimed in claim 4, wherein the sucking unit comprises:

a sucking mount; and a groove fitted around an inside of the sucking mount underneath the top cover; and an airtight ring embedded in the groove so as to maintain an airtight space between the sucking unit and the substrate.

6. The device claimed in claim 5, further comprising:

a pump;

a pressure sensor; and a tube connecting the pump and the pressure sensor, wherein the sucking unit further comprises:

an opening for receiving the tube, wherein the pump sucks out air in a space between the sucking unit and the substrate, in order to adhere the sucking unit to the substrate.

7. The device claimed in claim 2, further comprising:

an object lens provided between the gas window and the optical unit, wherein the gas window comprises:

a conical-shaped upper window, wherein a conical-shaped cavity is provided between the flat lower window and the conical-shaped upper window.

8. The device claimed in claim 7, wherein the round groove is provided directly beneath the conical-shaped upper window.

9. The device claimed in claim 8, wherein the laser irradiating hole is smaller in size than the flat lower window.

10. The device claimed in claim 1, wherein the first laser light is irradiated through the gas window at black defects in order to vaporize the black defects; and the second laser light is irradiated through the gas window at white defects with material gas in order to form film over the white defects.

11. The device claimed in claim 1, wherein:

the gas window blows purge gas, which prevents a window for conducting laser light from clouding, and carrier gas, which is included in CVD gas for carrying material gas; and a main component of the purge and carrier gases is helium gas.

12. The device claimed in claim 1, wherein the gas window is provided beneath the substrate and blows the material gas upwards towards the surface of the substrate.

13. The device claimed in claim 1, wherein the first and second openings are provided on opposite sides of the gas window.

14. The device claimed in claim 1, wherein the second opening is provided on one side of the laser irradiating hole, the second opening providing material gas directly into the laser irradiating hole, and wherein the third opening is provided against one end of the round groove, the third opening sucking the purge gas out of the gas window by way of a sucking force applied to the round groove.

* * * * *